United States Patent [19]

Edme

[11] Patent Number: 5,175,706
[45] Date of Patent: Dec. 29, 1992

[54] PROGRAMMING VOLTAGE GENERATOR CIRCUIT FOR PROGRAMMABLE MEMORY

[75] Inventor: Franck Edme, Aix en Provence, France

[73] Assignee: SGS-Thomson Microelectronics S.A., Gentilly, France

[21] Appl. No.: 707,255

[22] Filed: May 23, 1991

Related U.S. Application Data

[63] Continuation of Ser. No. 624,328, Dec. 7, 1990, abandoned.

[30] Foreign Application Priority Data

Dec. 7, 1989 [FR] France .................. 89 16198

[51] Int. Cl.⁵ ........................................ G11C 17/00
[52] U.S. Cl. ................................ 365/226; 365/45; 365/227; 307/529
[58] Field of Search ............ 365/226, 227, 228, 45, 365/189.01, 229; 307/529

[56] References Cited

U.S. PATENT DOCUMENTS 4,447,747 5/1984 La Potin .......................... 307/529

FOREIGN PATENT DOCUMENTS 0217718 8/1987 European Pat. Off. .

OTHER PUBLICATIONS

No Waiting–EEPROM at Work by Kendall Pope Computer Design vol. 22 No. 7 pp. 191–196 Jun. 1983.

Primary Examiner—Terrell W. Fears

[57] ABSTRACT

Electrically programmable memories often include an internal circuit for establishing a programming voltage Vpp higher than the supply voltage. This circuit is formed by a charge pump followed by a voltage regulator. Previously, an analog circuit was usually provided behind the regulator to convert the level of voltage Vpp, set up by the charge pump, into a signal with a slow-rising edge (to reduce the constraints on the programmed cells and increase their lifetime). Instead of such analog circuit, the present invention provides a digital control circuit to control the regulator to set up a regulation voltage that rises gradually from a low value up to the desired value Vpp. The digital control circuit comprises counter with k outputs which enables the gradual short-circuiting and unshort-circuiting of the various series-mounted transistors constituting the regulator, thus making the regulation voltage increase slowly.

28 Claims, 3 Drawing Sheets

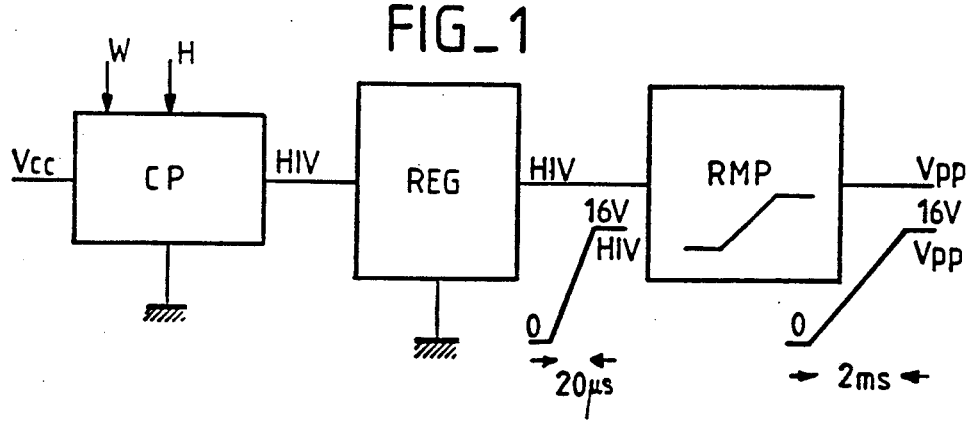
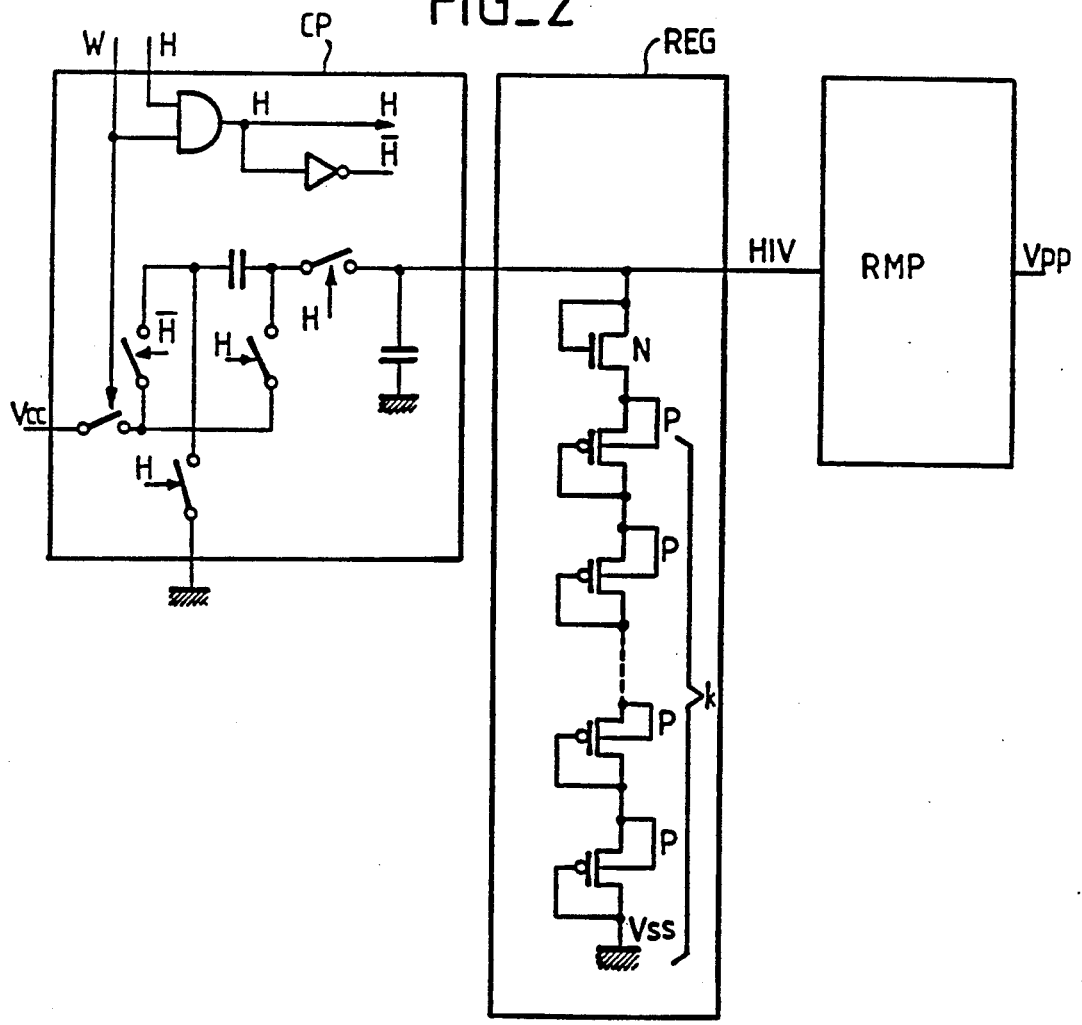

PROGRAMMING VOLTAGE GENERATOR CIRCUIT FOR PROGRAMMABLE MEMORY

This is a continuation of application Ser. No. 07/624,328, filed on Dec. 7, 1990, now abandoned.

BACKGROUND OF THE INVENTION

1. Field of the Invention

The invention concerns electrically programmable memories in integrated circuit form, generally known as EEPROMs or EPROMs, depending on whether or not they are electrically erasable, or as flash EPROMs if they are erasable in blocks.

2. Description of the Prior Art

To program these memories, it is generally necessary to have a "programming voltage" Vpp, available in the integrated circuit. This voltage Vpp is appreciably higher than the normal supply voltage Vcc of the circuit. For example, Vcc is usually equal to 5 volts and Vpp to 15 volts or more.

In certain memories, the programming voltage Vpp is given by an external supply. This fact, however, then calls for an additional specific supply terminal for the integrated circuit. The additional terminals add to the cost of the integrated circuits and it is preferred to avoid them.

This is why integrated memories are proposed, wherein the programming voltage Vpp is produced within the integrated circuit itself, out of the normal supply voltage Vcc. To this end, a circuit conventionally known as a charge pump or voltage multiplier is used. This circuit receives Vcc and sets up a voltage Vpp higher than Vcc.

Booster circuits basically and quite simply use switches, two capacitors and a two-phase clock to actuate the switches. In an initial period, the first capacitor is charged to 5 volts, then it is discharged into the second capacitor. Then a cycle recommences: in a first period, the first capacitor is charged to 5 volts and, in a second period, it is discharged into the second capacitor (this time, the second capacitor is already partially charged). The voltage at the terminals of the second capacitor then increases. Continuing in this way, within a few strokes of the two-phase clock, a voltage which is the double of Vcc is reached at the second capacitor. With two stages, the voltage Vcc is multiplied fourfold within a few clock strokes.

The output voltage of a multiplier circuit with several stages is regulated by a regulator as shown in FIG. 1. This regulator is constituted by a chain of transistors which are mounted as diodes so that each of them sets up a voltage, between its source and its drain, equal to its threshold voltage. Depending on the technology implemented, the threshold voltage is variable and the number of series-mounted transistors makes it possible to define the regulated voltage at output of the regulator.

For example, for a threshold voltage of the order of 1 volt for the transistors in series, mounted as diodes, sixteen transistors are needed to set up a regulated voltage Vpp of the order of 16 volts.

One of the problems of these assemblies for producing Vpp within the integrated circuit is that the voltage at output of the voltage multiplier and at the terminals of the regulator increases too rapidly: with a clock having a frequency of the order of one megahertz, only a few microseconds are needed, for example 20 microseconds for the voltage to reach Vpp.

Now, it has been realised that when Vpp increases too swiftly, the lifetime of the cells of the memory programmed by Vpp diminishes considerably. For Vpp is produced only when a cell is being programmed, and the rising front of Vpp is applied directly to the memory cell during programming. The excessively swift rise time of Vpp produces electrical fields inducing a deterioration of the gate oxide of the floating-gate transistors constituting the memory.

To reduce the speed of the rise time, the arrangement generally used, at output of the regulator is an analog circuitry which is complex and bulky, difficult to design and put into final shape, and sensitive to technological parameters and to the temperature. This circuitry produces a voltage Vpp rising in a ramp with a rise time of the order of one to two milliseconds. This is far more appropriate and enables the lifetime of the cells to be increased from 1000 programmings to 100,000 programmings.

An aim of the invention is to propose a circuit that is far simpler to implement, which can be used to limit the rise time of Vpp and thus increase the lifetime of the programmed cells. Instead of setting up an analog ramp at output of the regulator, the invention provides for the digital control of the increase in the voltage set up by the regulator itself, by means of a digital counter, the counting frequency of which is such that the regulated voltage increases with the desired slowness.

SUMMARY OF THE INVENTION

To this end, there is proposed an electrically programmable memory comprising a circuit for establishing a programming voltage Vpp from a lower supply voltage Vcc, the circuit for establishing Vpp including a voltage multiplier circuit followed by a voltage regulator used to limit the voltage Vpp to a desired limit value, wherein there is provided a means to digitally control the regulator in such a way as to achieve a gradual increase, in the limit voltage that it establishes, from a low value up to the desired value of the programming voltage Vpp.

The regulator preferably has a set of series-mounted transistors, and the digital control means successively and serially connects one, then two, then three (and so on) transistors of the regulator, on command by a counter controlled by a clock so as to achieve a gradual increase, at the rate of the clock, in the voltage at the terminals of the series-connected set.

The transistors are mounted as diodes and set up a voltage, between their source and drain, that is equal to their threshold voltage. The digital control means preferably includes a counter capable of setting up a logic state determined successively at each of its outputs, and switches commanded by the outputs of the counter to initially short-circuit the transistors, then progressively "unshort-circuit" them one after the other as and when the counting takes place. The counter may also directly control the transistors themselves so as to place them first of all in a configuration where they are completely conductive and then in a configuration where they set up a threshold voltage between source and drain (in being mounted as diodes).

Preferably, each of the transistors is made in a separate well diffused in a semiconductor substrate.

The counter is a circuit with k outputs. At each clock stroke, this circuit establishes a determined logic level on a new output and, each time, it maintains the level set up at the previous output. The counter does not return to zero, when all the k outputs have been activated. The activated levels, used to unshort-circuit the transistors, remain activated for as long as the programming voltage Vpp should stay present.

The regulator preferably has yet another additional transistor, of a type opposite to that of the others, mounted with its gate and its drain connected.

BRIEF DESCRIPTION OF THE DRAWINGS

Other characteristics and advantages of the invention will appear from the following detailed description, made with reference to the appended drawings, of which:

FIG. 1 shows a block diagram of a circuit for establishing the programming voltage Vpp in the prior art;

FIG. 2 shows a more detailed diagram of the circuit of FIG. 1;

MORE DETAILED DESCRIPTION

Figure 3:
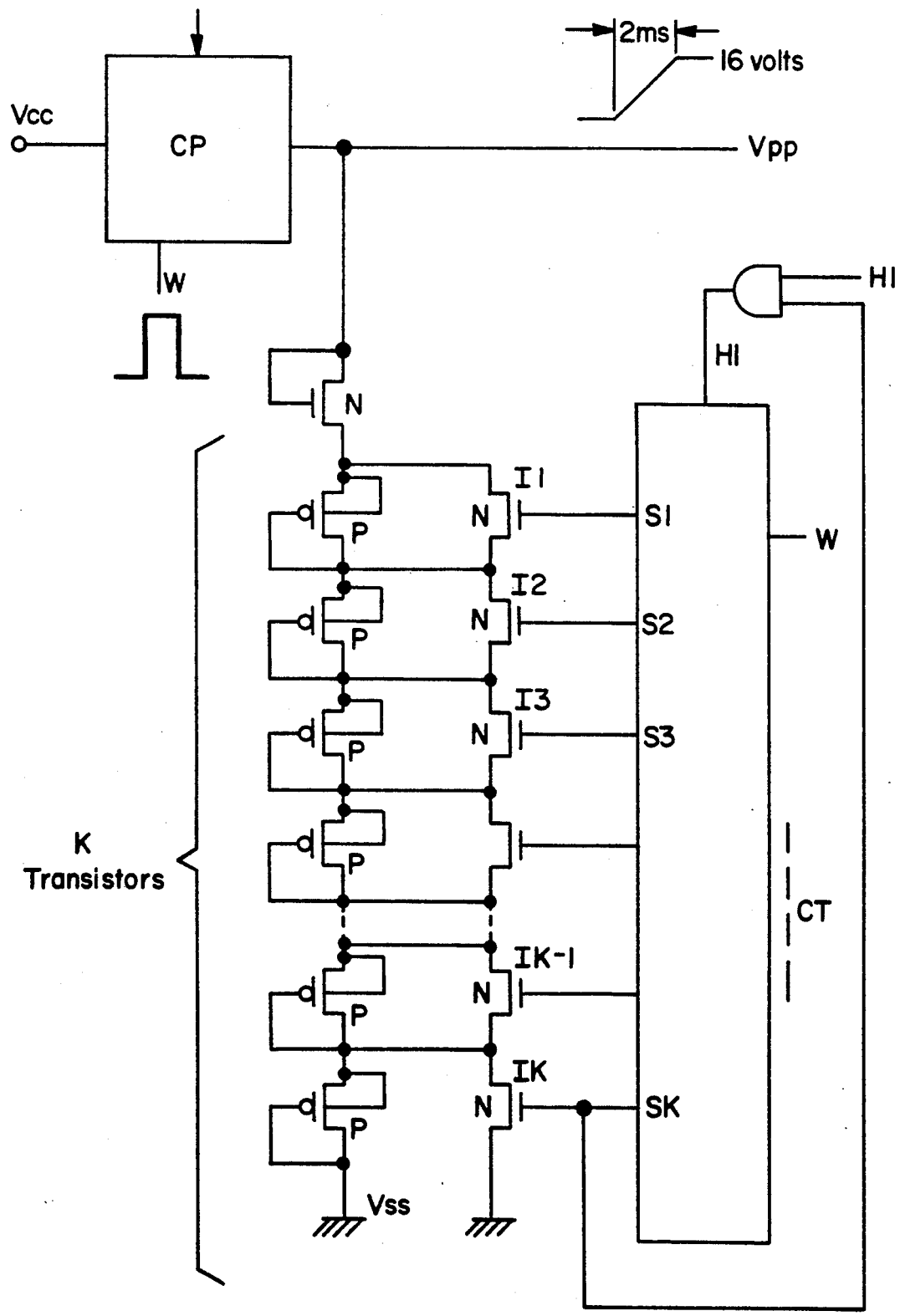
FIG. 3 shows an embodiment of the invention.

The principle of a circuit for establishing the voltage Vpp, in a prior art electrically programmable memory, is recalled in FIG. 1.

The circuit has, firstly, a "charge pump" CP which is a voltage multiplier circuit receiving, firstly, the normal supply voltage Vcc (generally 5 volts) and, secondly, a clock signal H, and giving a higher voltage HIV which is applied to a voltage regulator REG. The charge pump CP is activated only when a step of writing in the programmable memory has to be carried out. It is possible to provide, for example, for a write control signal W to be applied to the charge pump CP to trigger the production of a voltage HIV.

The function of the voltage regulator REG is to limit the voltage HIV to a determined value, for example 16 volts.

At output of the regulator, when the writing signal W is activated, there is obtained a voltage increasing, with a fairly steep rising edge (for example 20 microseconds), up to the value HIV defined by the regulator. Indeed, the clock is a fairly fast one (for example one megahertz or more) and only a few clock cycles are needed for the charge pump to give a potential of 16 volts for example.

Since it has been observed that this excessive speed of the rise in voltage causes a reduction in the lifetime of the cells programmed by means of the voltage HIV thus obtained, an analog circuit RMP is placed at the output of the regulator. The function of this analog circuit RMP is to establish a more gradually increasing ramp of the programming voltage. This circuit RMP receives the voltage HIV and gives a voltage in the form of a ramp rising from 0 to a value Vpp (which may be equal to the value HIV), the slope of increase being about one to two milliseconds from 0 to Vpp. This value of one to two milliseconds results from a compromise between the need not to damage the cells and the need to restrict the duration of the programming operations.

The circuits RMP used in the prior art are complex (typically having several tens of transistors), bulky (they use capacitors) and highly dependent on the technological manufacturing parameters and on the temperature.

FIG. 2 shows certain elements of FIG. 1 in greater detail. In particular, it gives a symbolic view, by way of illustration, of a possible way to make a charge pump CP with only one stage. It also gives a detailed view of the regulator REG.

The regulator REG essentially comprises a set of k transistors in series, each transistor being mounted as a diode, with its gate connected to its drain so that, between the drain and source of each transistor, a voltage equal to the threshold voltage of this transistor is set up. Hence, at the terminals of the series-mounted set of k transistors, once the voltage at the terminals of this set puts them into saturation mode, a voltage is established equal to the sum of the threshold voltages of all the transistors, i.e. equal to k times the threshold voltage of the transistors if they all have the same threshold voltage Vtp.

In the example shown, the series-mounted set has k P channel transistors for an embodiment on a P channel substrate, each of the transistors being made in a well separate from the others to have a more stable threshold voltage (through the elimination of the so-called "substrate" effect on the threshold voltage). The regulator preferably also has an additional transistor, which is an N channel transistor, series-mounted with the set of P channel transistors and made directly in the substrate. One end of the series-mounted set of the P channel transistors is connected to the ground potential Vss. The other end is connected to the source of the N channel transistor. This N channel transistor has its drain connected to the output voltage HIV of the charge pump.

The N channel transistor is itself mounted as a diode, with its gate connected to its drain. It has an accessory role and may be eliminated without in any way changing the principle of the invention.

The regulator, thus constituted by a set of transistors in series, mounted between the voltage HIV and the ground Vss, limits the voltage HIV to a value Vtn+kVtp. The necessary number k of transistors is chosen according to the desired value of the value Vpp and according to the value of the threshold voltages of the P channel and N channel transistors.

If necessary, there could be a number k of P channel transistors and a number k' of N channel transistors. However, there would be a lower stability of regulated voltage.

In one numerical example, the threshold voltage Vtp is of the order of 1 volt, and the threshold voltage Vtn is also of the order of 1 volt (for a natural type of transistor with substrate effect). About fifteen P channel transistors are needed to have a voltage Vpp of about fifteen volts.

FIG. 3 shows a diagram of an embodiment of a circuit for establishing Vpp according to the invention.

This circuit has the advantage of using exactly the same charge pump and the same regulator as in the prior art. But it no longer uses a ramp circuit RMP to convert a voltage HIV with a steep rising edge into a voltage Vpp with a more slow-rising edge. The desired voltage Vpp, with a slow-rising edge, is directly obtained at output of the charge pump and of the regulator.

To this end, a digital command by a counter CT is used to control the regulator and make it give a regulation voltage that is variable according to a desired profile.

The simplest example is shown in FIG. 3. It uses exactly the same regulator diagram as the one described with reference to FIG. 2. It also uses a counter CT with k outputs S1, S2, S3 ... Sk. The counter is controlled by a clock H1 which will generally be a clock obtained by frequency division from the clock H of the charge pump.

The outputs of the counter control switches I1, I2, ... Ik, are capable of short-circuiting or unshort-circuiting each of the transistors of the series-mounted set of k transistors of the regulator.

Thus, the output S1 makes it possible to short-circuit the P channel transistor closest to Vpp, the output S2 makes it possible to short-circuit the next one etc., and the output Sk makes it possible to short-circuit the P channel transistor connected to the ground. The logic levels present at the outputs S1, S2 ... are between 0 volts and the high voltage Vpp, the counter being consequently supplied by the voltage Vpp produced.

The counter is triggered during the command for the production of a voltage Vpp. This command is provided, for example, by the signal W which also triggers the charge pump. When starting up, the counter has all its outputs in a logic state such that they short-circuit all the transistors. In the example shown, the switches controlled by the outputs of the counter are N channel transistors and are short-circuited by a high-level voltage at their gate. It is assumed therefore that, at the outset, the outputs of the counter all give a high logic state.

The signal W then permits the counting by the counter. The counter is not a binary counter (or, if it is one, it is followed by a decoder). At the first clock stroke, it sets up a low state on the output S1 then, at the second clock stroke, it sets up a low state on the output S2 without modifying the low state of S1, and continuing in this way, it sets up a low state on each of the successive outputs up to Sk, leaving in place, at each time, the previous output in the state in which it had put it at the previous clock stroke. In sixteen clock strokes, in one example with sixteen P channel transistors, the outputs all change to the low state and all the transistors of the regulator are unshort-circuited to arrive at the constitution of the regulator according to FIG. 2.

When the last output Sk goes to the low state, it turns off the counting (for example by turning off the clock H1), so that the regulator remains in this configuration, up to the end of the command for producing Vpp or even, in practice, up to a new command for establishing Vpp (new writing signal W).

The result thereof is that, even if the charge pump produces a high voltage very swiftly, the regulator will restrict this voltage to a value which will be first of all Vtn (threshold voltage of the transistor N of the series-mounted set), then Vtn+Vtp, then Vtn+2Vtp, etc., up to Vtn+kVtp, namely the desired final voltage Vpp.

The voltage Vpp thus limited by the variable threshold regulator will rise in steps at the rate of the clock H1 (which can be easily controlled with precision and prepared by frequency division of the clock H of the charge pump).

Figure 4:
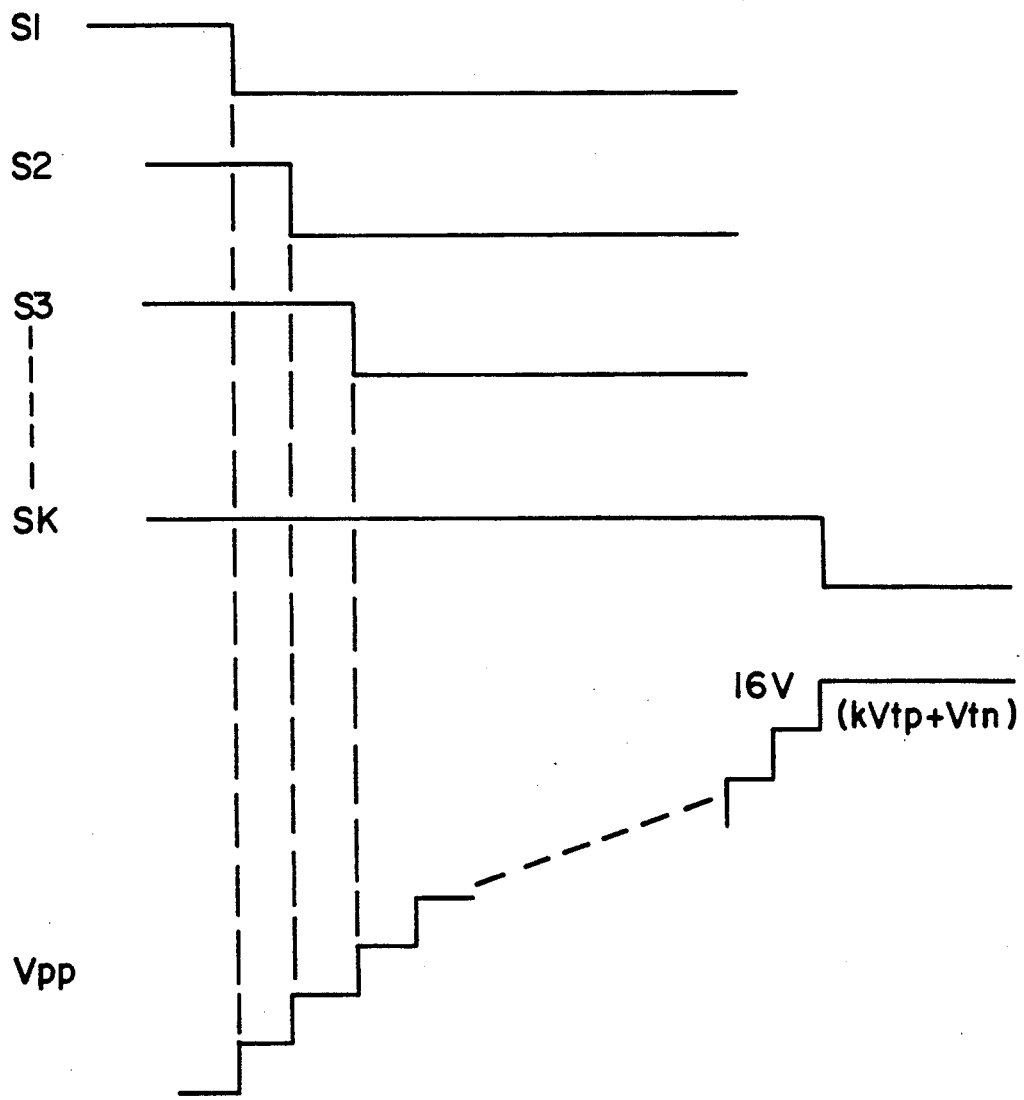
FIG. 4 shows a timing diagram of electrical signals corresponding to the circuit of FIG. 3.

FIG. 4 represents this increase in the limit voltage of the regulator (hence the increase in Vpp) in relation with the switching-over of the logic state of the successive outputs S1 to Sk of the counter CT.

In one numerical example drawing inspiration from the one used in the prior art, there will be, for example, an N channel transistor in series with 16 P channel transistors, the threshold voltages being equal to about one volt. In this case, the counter will have 16 outputs and, to obtain a voltage going from 0 volts to 16 or 17 volts approximately in a little less than 2 milliseconds, a 10 kilohertz clock H1 will have to be taken. More generally, to obtain a rise time Tm, with a counter having k outputs and a regulator having k possible limit voltages, a clock with a frequency k/Tm will be used. The frequency could be between k/2 and k kilohertz for a rise time of 1 to 2 milliseconds.

Experience shows that the steps of the voltage Vpp are not a great hindrance. Firstly, they exist only during the transitory phase for the rise of Vpp. Secondly, the numerous unwanted resistances and capacitances of the circuits that Vpp is designed to supply, very sharply attenuate these steps.

What is claimed is:

1. An electrically programmable memory comprising a voltage generating circuit for establishing a programming voltage Vpp higher than a normal supply voltage of the memory, this voltage generating circuit including a voltage multiplier circuit delivering the voltage Vpp at its output and being followed by a voltage regulator to limit the voltage Vpp to a desired limit value, wherein there is provided a digital control means to digitally control the regulator in such a way as to achieve a gradual increase, by steps, in the limit voltage set up by the voltage regulator at the output of the voltage multiplier circuit, from a low value up to the desired value of Vpp.

2. An electrically programmable memory according to claim 1, wherein the regulator includes, between the voltage Vpp and the ground, a set of transistors in series, mounted as diodes with each transistor setting up a voltage, between its source and drain, that is equal to its threshold voltage, and wherein the digital control means includes a counter having a plurality of outputs and being capable of setting up a determined logic state successively at each of its outputs, and a means controlled by the outputs of the counter to initially short-circuit the transistors and then unshort-circuit them gradually one after the other as and when the counting takes place.

3. An electrically programmable memory according to claim 2, wherein the counter is a circuit with k outputs which, at each clock stroke, sets up a determined logic level on a new output of said counter, leaving in place, at each time, the level set up at the previous output of said counter, and wherein there is provision for a means to stop the counting when the last output of said counter has been placed at a determined level.

4. An electrically programmable memory according to claim 3, wherein the counter and the voltage multiplier circuit are activated by a signal that commands the programming of the memory.

5. An electrically programmable memory according to claim 4, wherein the digital control means increments the counter at a frequency of the order of k/2 to k kilohertz to obtain a rising time of the voltage Vpp of the order of 1 to 2 milliseconds.

6. An electrically programmable memory according to claim 4, wherein each of the transistors is made in a separate well diffused in a semiconductor substrate.

7. An electrically programmable memory according to claim 6, wherein the transistors are of the same type, and wherein the regulator includes at least one additional transistor of an opposite type.

8. An electrically programmable memory according to claim 2, wherein the counter includes k outputs and wherein the digital control means increments the outputs of the counter at a frequency of the order of k/2 to k kilohertz to obtain a rising time of the voltage Vpp of the order of 1 to 2 milliseconds.

9. An electrically programmable memory according to claim 2, wherein each of the transistors is made in a separate well diffused in a semiconductor substrate.

10. An electrically programmable memory according to claim 9, wherein the transistors are of the same type, and wherein the regulator includes at least one additional transistor of an opposite type.

11. An electrically programmable memory according to claim 3, wherein the digital control means increments the outputs of the counter at a frequency of the order of k/2 to k kilohertz to obtain a rising time of the voltage Vpp of the order of 1 to 2 milliseconds.

12. An electrically programmable memory according to claim 3, wherein each of the transistors is made in a separate well diffused in a semiconductor substrate.

13. An electrically programmable memory according to claim 12, wherein the transistors are of the same type, and wherein the regulator includes at least one additional transistor of an opposite type.

14. An electrically programmable memory according to claim 1, wherein the digital control means includes k outputs and a circuit for incrementing the outputs at a frequency of the order of k/2 to k kilohertz to obtain a rising time of the voltage Vpp of the order of 1 to 2 milliseconds.

15. A voltage generating circuit for establishing a voltage Vpp higher than a normal supply voltage, comprising a voltage multiplier circuit delivering the voltage Vpp at its output and being followed by a voltage regulator to limit the voltage Vpp to a desired limit value, wherein there is provided a digital control circuit to digitally control the regulator in such a way as to achieve a gradual increase, by steps, in the limit voltage set up by the voltage regulator at the output of the voltage multiplier circuit, from a low value up to the desired value of Vpp.

16. A voltage generating circuit according to claim 15, wherein the regulator includes, between the voltage Vpp and the ground, a set of transistors in series, mounted as diodes with each transistor setting up a voltage, between its source and drain, that is equal to its threshold voltage, and wherein the digital control circuit includes a counter having a plurality of outputs and being capable of setting up a determined logic state successively at each of its outputs, a clock for providing clock pulses to said counter, and a circuit controlled by the outputs of the counter to initially short-circuit the transistors and then unshort-circuit them gradually one after the other as and when the counting of the clock pulses by the counter takes place.

17. A voltage generating circuit according to claim 16, wherein the counter includes k outputs and wherein the digital control circuit increments the outputs of the counter at a frequency of the order of k/2 to k kilohertz to obtain a rising time of the voltage Vpp of the order of 1 to 2 milliseconds.

18. A voltage generating circuit according to claim 16, wherein each of the transistors is made in a separate well diffused in a semiconductor substrate.

19. A voltage generating circuit according to claim 18, wherein the transistors are of the same type, and wherein the regulator includes at least one additional transistor of an opposite type.

20. A voltage generating circuit according to claim 16, wherein the counter is a circuit with k outputs which, at each clock pulse inputted thereto, sets up a determined logic level on a new output of said counter, leaving in place, at each time, the level set up at the previous output of said counter; and further comprising a circuit to stop the counting of the clock pulses when the last output of said counter has been placed at a determined level.

21. A voltage generating circuit according to claim 20, wherein the digital control circuit increments the outputs of the counter at a frequency of the order of k/2 to k kilohertz to obtain a rising time of the voltage Vpp of the order of 1 to 2 milliseconds.

22. A voltage generating circuit according to claim 20, wherein each of the transistors is made in a separate well diffused in a semiconductor substrate.

23. A voltage generating circuit according to claim 22, wherein the transistors are of the same type, and wherein the regulator includes at least one additional transistor of an opposite type.

24. An electrically programmable memory comprising a voltage generating circuit according to claim 20 for establishing the programming voltage Vpp for the memory, and wherein the counter and the voltage multiplier circuit are activated by a signal that commands the programming of the memory.

25. An electrically programmable memory according to claim 24, wherein the digital control circuit includes k outputs and a circuit for incrementing the outputs at a frequency of the order of k/2 to k kilohertz to obtain a rising time of the voltage Vpp of the order of 1 to 2 milliseconds.

26. An electrically programmable memory according to claim 24, wherein each of the transistors is made in a separate well diffused in a semiconductor substrate.

27. An electrically programmable memory according to claim 24, wherein the transistors are of the same type, and wherein the regulator includes at least one additional transistor of an opposite type.

28. A voltage generating circuit according to claim 15, wherein the digital control circuit includes k outputs and a circuit for incrementing the outputs at a frequency of the order of k/2 to k kilohertz to obtain a rising time of the voltage Vpp of the order of 1 to 2 milliseconds.

* * * * *